(12) United States Patent  
Chou et al.

(10) Patent No.: US 7,254,309 B1  
(45) Date of Patent: Aug. 7, 2007

(54) SIDE EMITTING LED AND LENS

(75) Inventors: Wen-Bin Chou, Miao-Li Country (TW); Tzeng-Ke Shiau, Miao-Li Country (TW); Teng-Chao Hou, Miao-Li Country (TW)

(73) Assignee: Coretronic Corporation, Chu-Nan (TW)

( * ) Notice: Subject to any disclaimer, the term of this patent is extended or adjusted under 35 U.S.C. 154(b) by 0 days.

(21) Appl. No.: 11/486,021

(22) Filed: Jul. 14, 2006

(51) Int. Cl.  
*G02B 6/10* (2006.01)  
*F21V 5/00* (2006.01)

(52) U.S. Cl. ..................... 385/146; 362/327
(58) Field of Classification Search .............. None  
See application file for complete search history.

(56) References Cited

U.S. PATENT DOCUMENTS 5,898,267 A * 4/1999 McDermott ............. 313/512

6,679,621 B2    1/2004  West et al.
7,142,769 B2 * 11/2006  Hsieh et al. ............. 385/146

* cited by examiner

*Primary Examiner*—Tina M. Wong  
(74) *Attorney, Agent, or Firm*—Birch, Stewart, Kolasch & Birch, LLP

(57) ABSTRACT

A lens of a side emitting LED includes a bottom surface, an incident surface, a reflective surface, a first refractive surface, a second refractive surface and a third refractive surface. An light emitted by a LED enters the lens through the incident surface. A portion of the light is reflected by the reflective surface in an internal total reflection manner to the second refractive surface and emits out of the lens along a first optical path. The other portion of light directly emits out of the lens through the first refractive surface and the third refractive surface. A transitive surface is located between the first refractive surface and the reflective surface. Such a design allows the light entered the lens through the incident surface not cross with the transitive surface. Hence an improper reflection or refraction can be prevented.

12 Claims, 6 Drawing Sheets

SIDE EMITTING LED AND LENS

FIELD OF THE INVENTION

The present invention relates to a side emitting light emitting diode (LED) and particularly to a lens of a side emitting LED.

BACKGROUND OF THE INVENTION

In general, a light emission of a conventional light emitting diode (LED) is that the light emission path is normal to the light emission surface of the LED chip, and a Lambertion energy distribution fashion is presented (referring to FIG. 1A). For applications in traffic lights, illumination or other indicative signals, due to the limitation of energy distribution profile, if a plurality of LEDs are mixed optically (such as mixing of light intensity, color lights, or the like), a desired mixing result is obtained only at a selected distance from the light emission surface of the LEDs (referring to FIG. 1B). There is an ineffective distance L1 where mixing cannot be performed. However, if the lighting profile of the individual LEDs is flattened, the ineffective distance can be shortened.

Lumileds Co. announced a side emitting LED in the SID seminar in 2003. It disclosed the side emitting LED with a special package structure (referring to FIG. 2). Adopted such a structure, the side emitting LED has only a small portion of light energy (less than 10%) emits through the upper side (in a direction of a central optic axis 14 of the LED chip). Most light energy emits in lateral directions. In practical applications, this type of side emitting LED reflects the light energy which emits upwards through a mask 16 attached to the upper side thereof. Lumileds Co. also has obtained U.S. Pat. No. 6,679,621 entitled "Side emitting LED and lens" for that technique.

In U.S. Pat. No. 6,679,621, Lumileds Co. discloses a package structure such as a lens (referring to FIG. 3). It included an incident surface 10, a reflective surface 11, a first refractive surface 12 and a second refractive surface 13. The first refractive surface 12 and the central optic axis 14 of the LED chip form an angle. The second refractive surface 13 is connected smoothly to the first refractive surface 12 and a bottom surface 15. A light emitted from the LED chip enters the package structure through the incident surface 10, and emits mainly along two paths P1 and P2. The light on the path P1 enters the package structure through the incident surface 10 to the reflective surface 11, is reflected to the first refractive surface 12 by the reflective surface 11, and then is refracted by the first refractive surface 12 to exit the package structure along the path P1. The light on the path P2 enters the package structure through the incident surface 10, and directly is refracted by the second refractive surface 13 to exit the package structure along the path P2. However, the package structure shown in FIG. 3 has problems, notably:

1. As the light is divided into two optical paths, an "optical path overlap" easily occurs on boundaries of the two optical paths. As a result, an improper reflection or refraction takes place. Referring to FIG. 4, there is an optical path overlap zone α between the first refractive surface 12 and the second refractive surface 13. If the light entered the package structure through the incident surface 10 enters the overlap zone α, it directly arrives the first refractive surface 12, and the improper reflection or refraction occurs.

2. Such a package structure has a narrow portion geometrically. As a result, the structure is not strong enough.

3. The profile of the package structure has many acute angles. It tends to form stress concentration during fabrication and results in deformation. As a result, it changes optical characteristics of the package structure.

SUMMARY OF THE INVENTION

Therefore one object of the present invention is to provide a side emitting LED lens that reduces "optical path overlap" on boundaries of two light paths to prevent an improper reflection or refraction, and decreases stress concentration during fabrication thereby to maintain the stability of optical characteristics and increase the strength of structure.

According to an embodiment of the invention, the lens is redesigned with a selected geometric profile to achieve the object previously discussed. The lens is located on a light emitting path of a light source. The lens includes a bottom surface, an incident surface, a reflective surface, a first refractive surface, a second refractive surface and a third refractive surface. A light enters the lens through the incident surface. A portion of the light is reflected by the reflective surface and is refracted by and emits out of the second refractive surface. The other portion of the light directly emits out of the lens through the first refractive surface and the third refractive surface. Hence there is no optical path overlap. An improper reflection or refraction can be prevented to reduce a light loss. Such the lens also forms without a narrow geometric profile. Thus an impact of fabrication stress is lower.

Another object of the invention is to provide a side emitting LED that directs a light emitted from the LED chip to lateral directions so that a light profile of the side emitting LED can be flattened. The light emits in parallel with the LED light emission surface at a contracted angle to improve conversion efficiency. The impact resulting from different lighting efficiencies of different LED chips also is reduced.

The side emitting LED according to the invention includes a semiconductor light emitting element (such as a LED chip) and a lens. The lens has a bottom surface, an incident surface, a reflective surface, a first refractive surface, a second refractive surface and a third refractive surface. A light emitted from a LED chip enters the lens through the incident surface. A portion of the light is reflected by the reflective surface to the second refractive surface in an internal total reflection manner. The second refractive surface refracts the light towards lateral directions. The other portion of light enters the lens directly and emits out of the lens towards the lateral directions to be refracted by the first refractive surface and the third refractive surface. The light passes through the reflective surface, first refractive surface, second refractive surface and third refractive surface, and then a direction of the light is corrected to become horizontal.

BRIEF DESCRIPTION OF THE DRAWINGS

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1A:
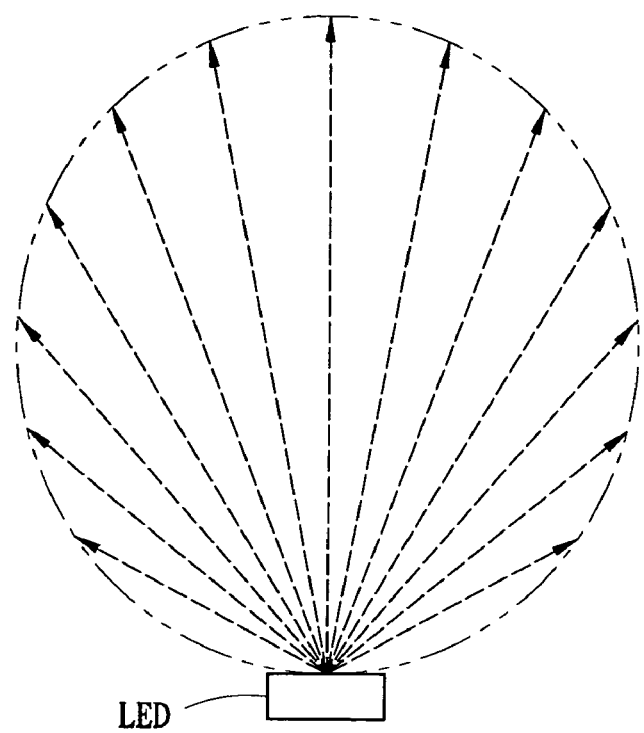
FIG. 1A is a schematic view of the lighting profile of a conventional LED chip.
Figure 1B:
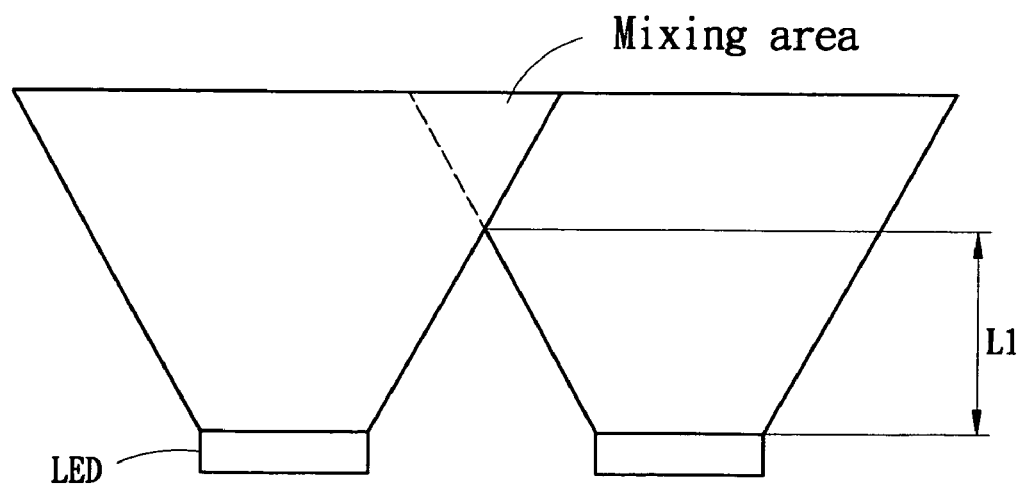
FIG. 1B is a schematic view of light mixing and distributing condition according to optical characteristics via conventional multiple LED chips.
Figure 2:
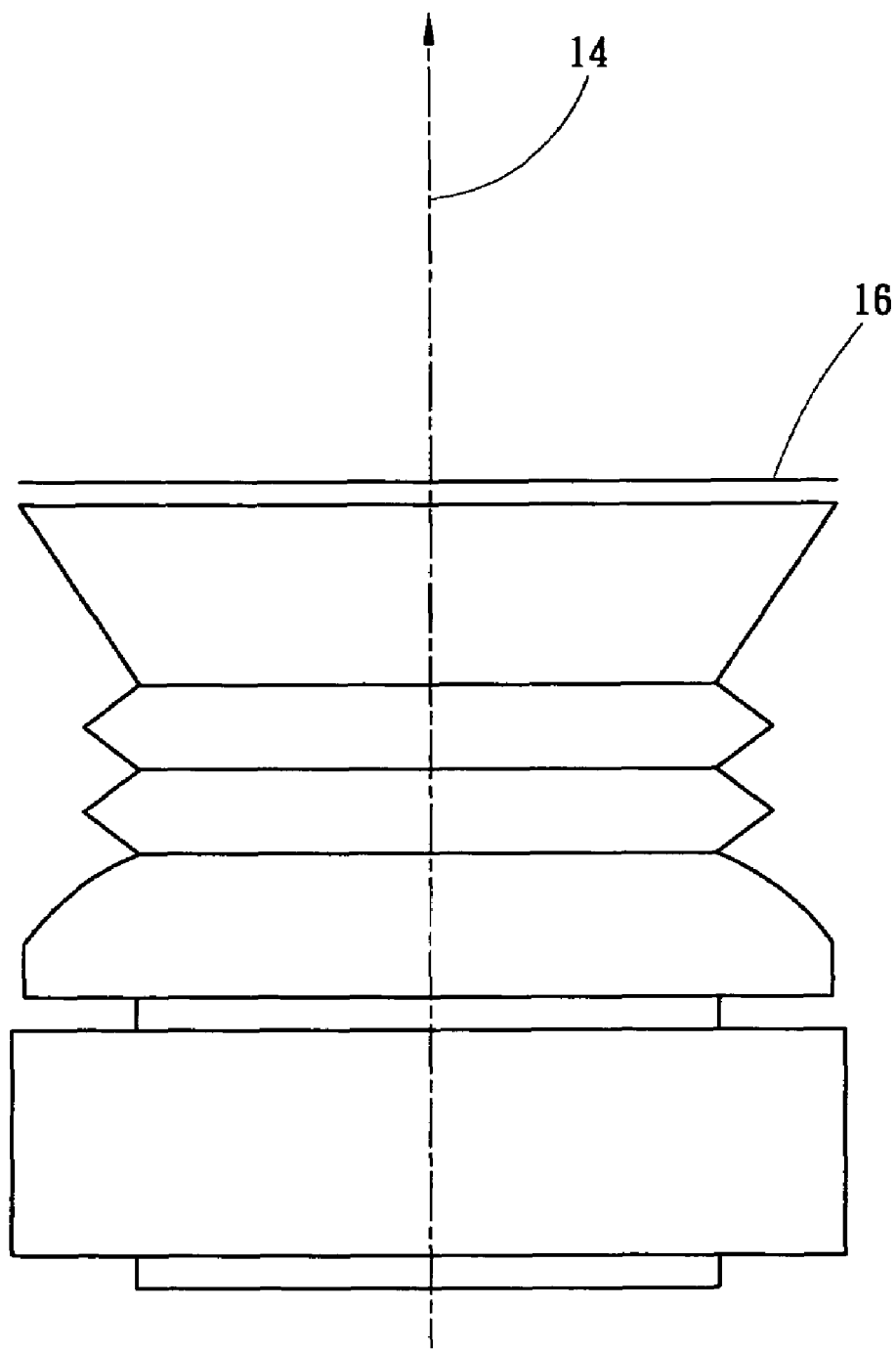
FIG. 2 is a schematic view of a conventional side emitting LED lens.
Figure 3:
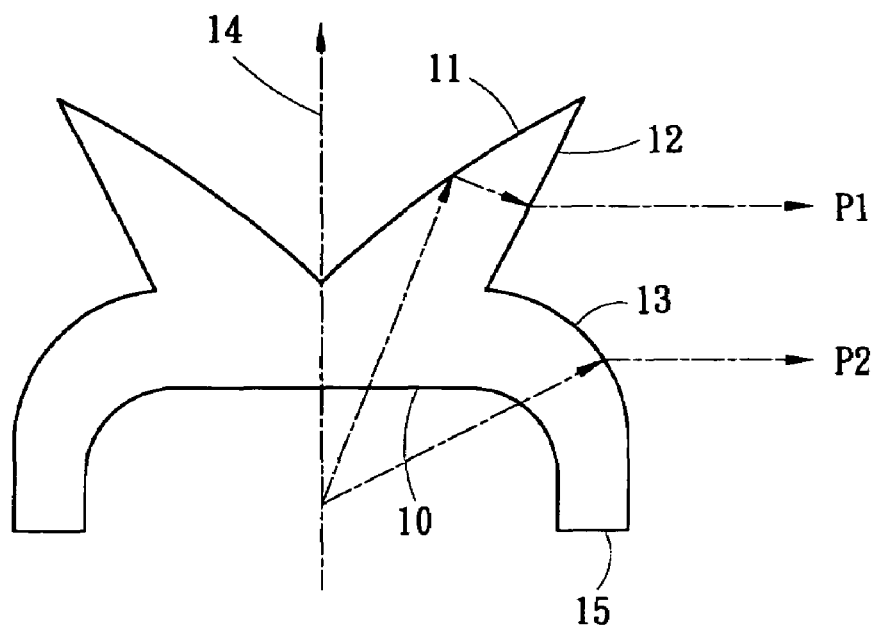
FIG. 3 is a schematic view of another conventional side emitting LED lens.
Figure 4:
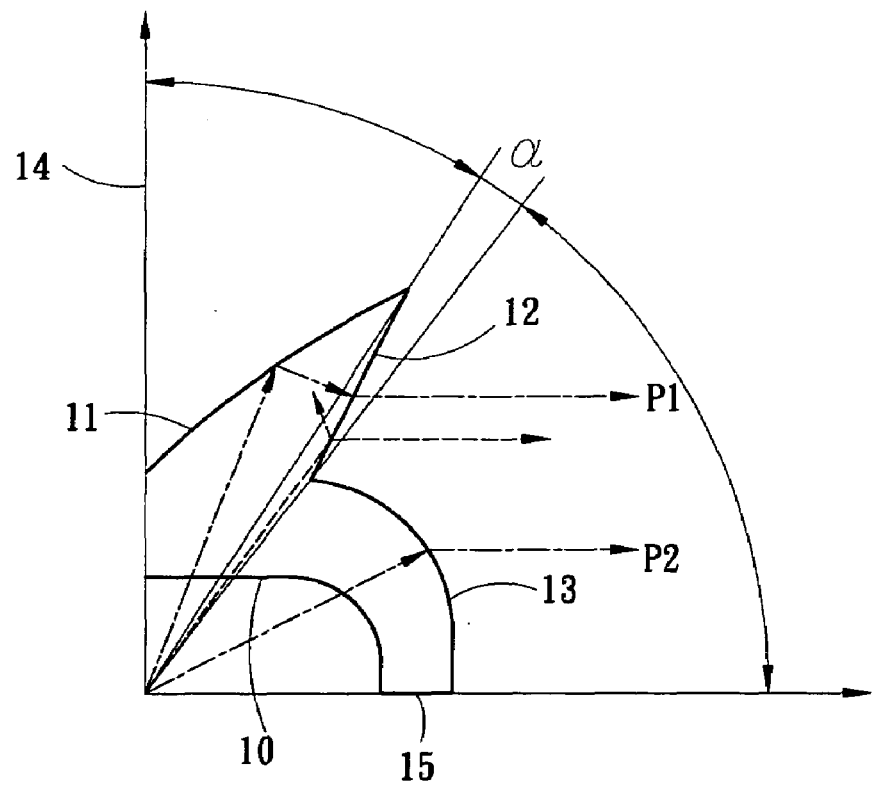
FIG. 4 is a schematic view of optical paths according to the LED lens shown in FIG. 3.
Figure 5:
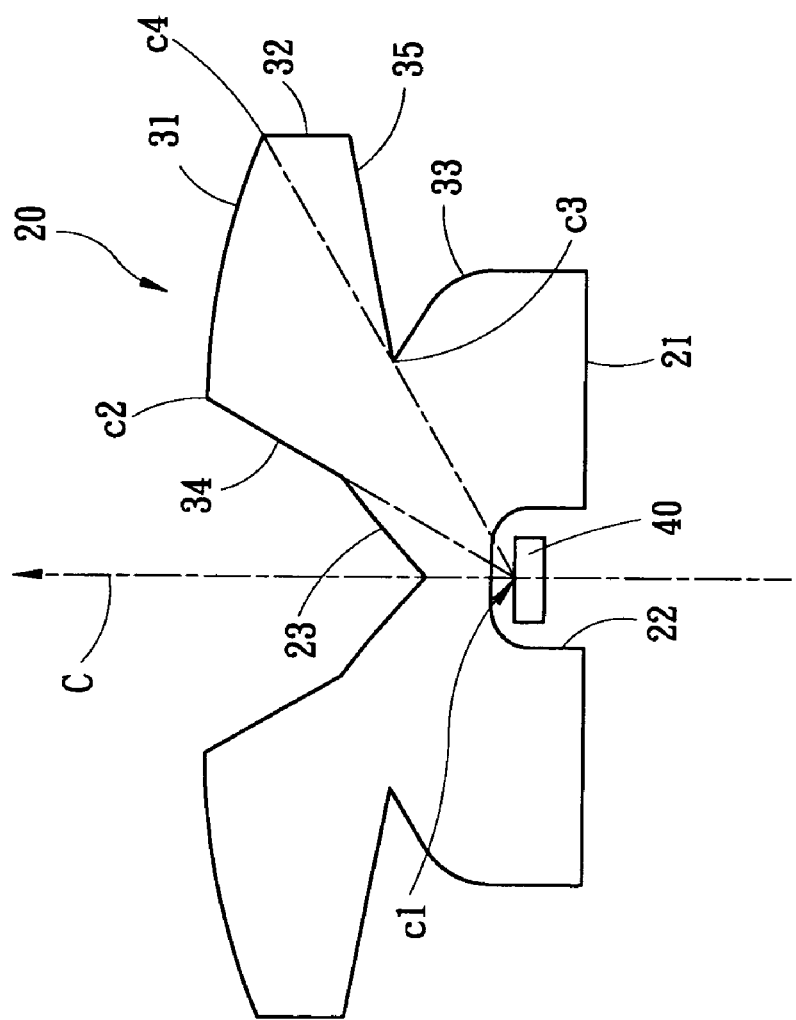
FIG. 5 is a schematic view of a side emitting LED lens structure according to the present invention.
Figure 6:
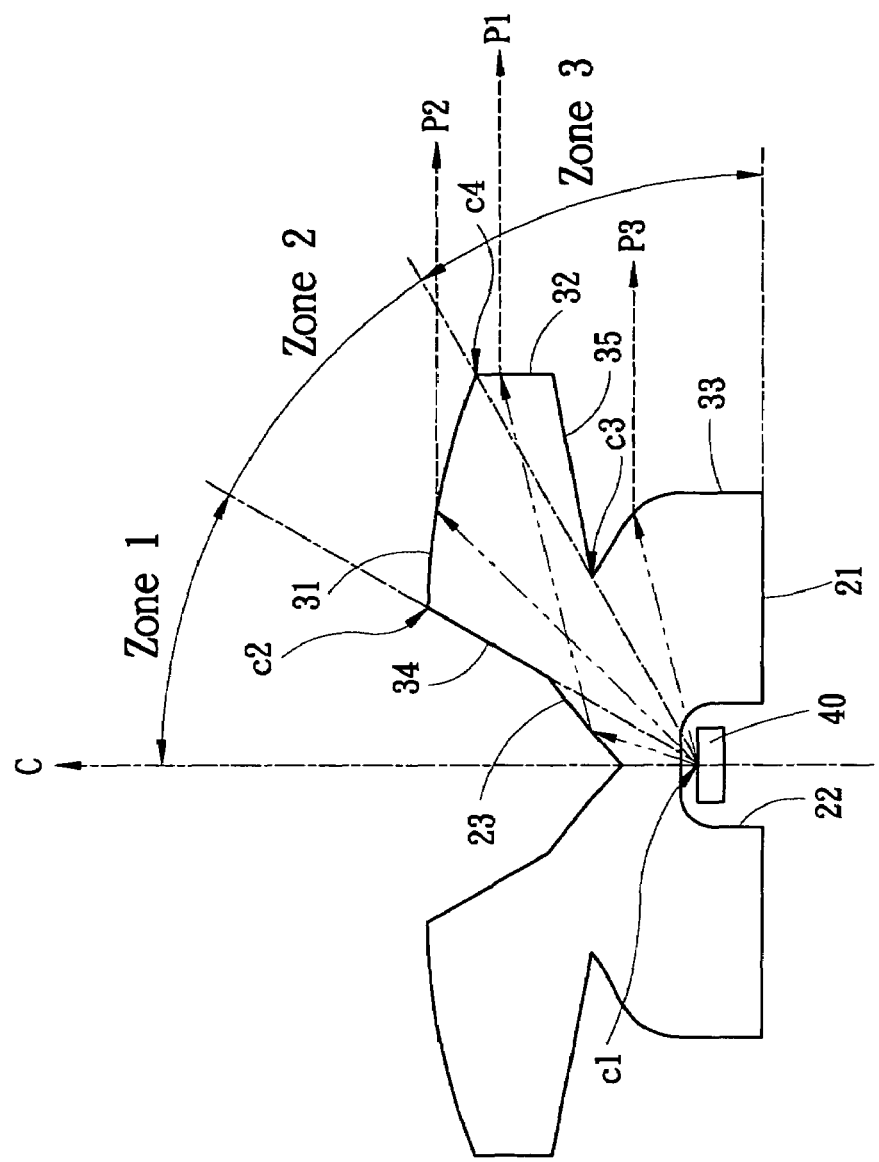
FIG. 6 is a schematic view of optical paths of the side emitting LED lens according to the present invention.

Please refer to FIG. 5 showing a side emitting light emitting diode (LED) of an embodiment of the present invention. The side emitting LED includes a lens 20 and a light source. The lens 20 of the embodiment includes a bottom surface 21, an incident surface 22, a reflective surface 23, a first refractive surface 31, a second refractive surface 32, a third refractive surface 33, a first transitive surface 34 and a second transitive surface 35. The lens 20 is a package structure for the light source, such as semiconductor lighting element. The semiconductor lighting element includes a LED chip 40 (as shown in FIG. 6). In the embodiment, a light emitted from the LED chip 40 is presented according to a Lambertion energy distribution (shown in FIG. 1A).

In the embodiment, the incident surface 22 is connected to the bottom surface 21 and surrounds the LED chip 40. The reflective surface 23 is surrounding and abutting to a central optic axis C of the lens 20 and forms an angle with the central optic axis C. The first transitive surface 34 is located between the first refractive surface 31 and the reflective surface 23. The first refractive surface 31 is smoothly connected to the first transitive surface 34 and the second refractive surface 32. An angle between the second refractive surface 32 and the central optic axis C of the lens 20 is determined by the angle between the reflective surface 23 and the central optic axis C. The second transitive surface 35 is located between the second refractive surface 32 and the third refractive surface 33. The third refractive surface 33 is connected to the bottom surface 21. The third refractive surface 33 has a smooth arch and is located between the second transitive surface 35 and the bottom surface 21.

Referring to FIG. 6, the light emitted from the LED chip 40 enters the lens 20 through the incident surface 22. A portion of the light is reflected by the reflective surface 23 to the second refractive surface 32 in an internal total reflection manner, and then the light is refracted by the second refractive surface 32 and emits out of the second refractive surface 32 of the lens 20 along a lateral direction of the lens 20, such as a first optical path P1 of the lens 20. The other portion of the light enters the lens 20 through the incident surface 22 and then directly emits out of the lens 20 to toward the lateral directions of the lens 20 respectively to be refracted by the first refractive surface 31 along a second optical path P2 and the third refractive surface 33 along a third optical path P3. The first optical path P1, the second optical path P2 and the third optical path P3 are in a direction substantially normal to the central optic axis C of the lens 20. Hence the light emitted from the LED chip 40 is directed towards a lateral direction of the lens 20.

For more detailed discussion of the structure of the lens 20, referring to FIG. 5, the LED chip 40 generally is seen as a point light source. The central optic axis C and a light emission surface of the LED chip 40 are cross to form a first cross point c1. A second cross point c2 is formed on a juncture of the first transitive surface 34 and the first refractive surface 31. A third cross point c3 is formed on a juncture of the third refractive surface 33 and the second transitive surface 35. A fourth cross point c4 is formed on a juncture of the first refractive surface 31 and the second refractive surface 32.

Figure 7A:
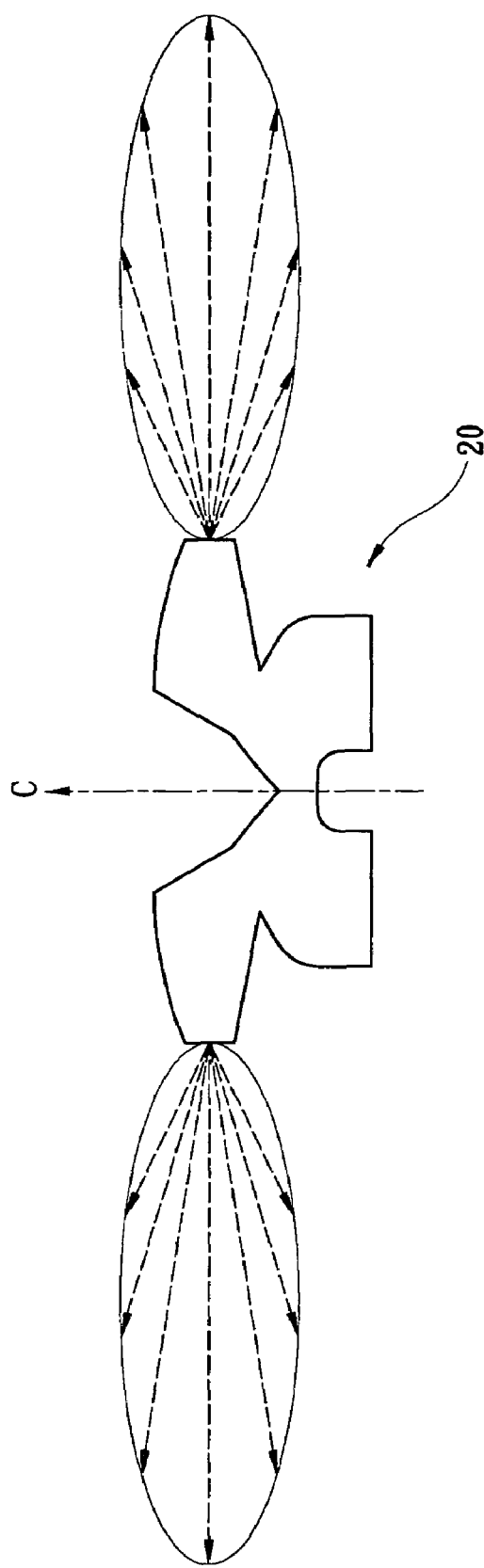
FIG. 7A is a schematic view of a lighting profile of the side emitting LED lens according to the present invention.
Figure 7B:
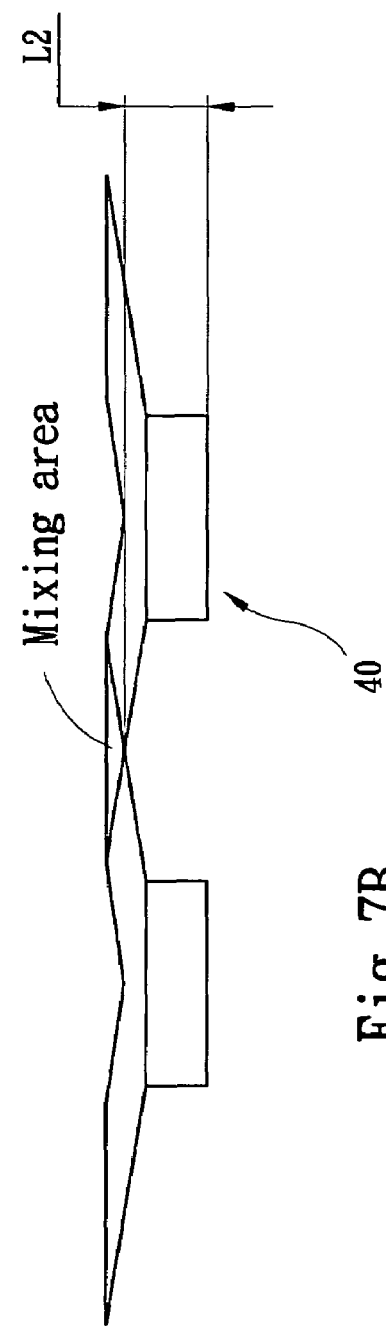
FIG. 7B a schematic view of a light mixing and distributing condition according to a plurality of side emitting LEDs according to the present invention.

Please refer to FIG. 6. After the light emitted from the LED chip 40 enters the lens 20, the intensity distribution of energy of the emitted light can be divided in a zone 1, a zone 2 and a zone 3. The zone 1 is located between the central optic axis C and the connection line of the first cross point c1 to the second cross point c2. The zone 2 is located between the connection line of the first cross point c1 to the fourth cross point c4 and the zone 1 (the third cross point c3 is located on the connection line of the first cross point c1 to the fourth cross point c4). The zone 3 is located between the zone 2 and the bottom surface 21. The energy distribution is strongest in the zone 1, then sub-strong in the zone 2, and weakest in the zone 3. In the zone 1 where the energy distribution is strongest, the light is reflected by the reflective surface 23 to the second refractive surface 32 and emits out of the lens 20 along the first optical path P1, and the energy strongest portion is arranged in a center portion of a lighting profile of the lateral direction of the lens 20 (referring to FIG. 7A). The light in the zone 2 is refracted through the first refractive surface 31. The light in the zone 3 is directly refracted through the third refractive surface 33. Hence the first refractive surface 31, second refractive surface 32 and third refractive surface 33 are responsible for controlling an emission path of the light source of one zone without affecting one another.

The surface of the first transitive surface 34 is extended in a direction according to a special design such that the light entered the lens 20 through the incident surface 22 does not cross with the first transitive surface 34. FIG. 5 illustrates a preferred design. The surface of the first transitive surface 34 extended in the direction is coinciding with the direction of the connection line of the first cross point c1 to the second cross point c2. Hence an improper reflection or refraction does not occur.

In the embodiment shown in FIG. 6, there is a small gap between the first cross point c1 and an incident spot on the incident surface 22 where the light enters. The gap affects a position of the first transitive surface 34. Hence a desirable design has to consider with the refraction occurred to the light which is emitted from the LED 40 and is refracted by the incident surface 22. According to the embodiment of the invention, the lens 20 can be directly packaged on a light emission side of the LED chip 40. The optic axis of the LED chip 40 coincides with the central optic axis C of the lens 20. The first cross point c1 is closest to the incident spot on incident surface 22. Then the surface of the first transitive surface 34 is extended in the direction coinciding with the connection line of the first cross point c1 to the second cross point c2.

The side emitting LED according to the invention can also contract the lighting profile of the LED chip 40 through the lens 20 (referring to FIG. 7A) to improve converging efficiency. A LED module fabricated with the lens 20 of the invention can be used on backlight modules and general illumination, especially in applications of a plurality of the LED chips 40. The lighting profile of each LED chip 40 can be flattened to shorten an ineffective distance L2 (referring to FIG. 7B). And an impact resulting from different lighting efficiencies of different LED chips 40 also can be reduced.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A lens adapted for a light source, comprising:
a bottom surface;
an incident surface connected to the bottom surface and surrounding the light source;
a reflective surface forming an angle with a central optic axis of the lens;
a first refractive surface;
a first transitive surface located between the reflective surface and the first refractive surface;
a second refractive surface connected to the first refractive surface;
a third refractive surface connected to the bottom surface; and
a second transitive surface located between the second refractive surface and the third refractive surface;
wherein a light emitted from the light source enters the lens through the incident surface, a portion of the light being reflected by the reflective surface to the second refractive surface, then being refracted by the second refractive surface and emitting out of the lens along a first optical path, the other portion of the light directly being refracted by the first refractive surface and emitting out of the lens along a second optical path, and being refracted by the third refractive surface and emitting out of the lens along a third optical path.

2. The lens of claim 1, wherein the reflective surface is surrounding and abutting to the central optic axis and the light emitted along the first optical path towards a center portion of a lighting profile of a lateral direction of the lens.

3. The lens of claim 1, wherein the light entered the lens through the incident surface does not cross with the first transitive surface.

4. The lens of claim 3, wherein an extended direction of the first transitive surface is coinciding with a connection line formed between a cross point of an emission surface of the light source to the central optic axis and a juncture of the first transitive surface and the first refractive surface.

5. The lens of claim 1, wherein a juncture of the second transitive surface and the third refractive surface is located on a connection line formed between a cross point of an emission surface of the light source to the central optic axis and a juncture of the first refractive surface and the second refractive surface.

6. The lens of claim 1, wherein the third refractive surface has a smooth arch and is located between the second transitive surface and the bottom surface.

7. A side emitting light emitting diode (LED), comprising:
a LED chip; and
a lens located on a light emission side of the LED chip, including:
a bottom surface;
an incident surface connected to the bottom surface and surrounding the light source;
a reflective surface forming an angle with a central optic axis of the lens;
a first refractive surface;
a first transitive surface located between the reflective surface and the first refractive surface;
a second refractive surface connected to the first refractive surface;
a third refractive surface connected to the bottom surface; and
a second transitive surface located between the second refractive surface and the third refractive surface;
wherein a light emitted from the light source enters the lens through the incident surface, a portion of the light being reflected by the reflective surface to the second refractive surface, then being refracted by the second refractive surface and emitting out of the lens along a first optical path, the other portion of the light directly being refracted by the first refractive surface and emitting out of the lens along a second optical path, and directly being refracted by the third refractive surface and emitting out of the lens along a third optical path.

8. The side emitting LED of claim 7, wherein the reflective surface is surrounding and abutting to the central optic axis and the light emitted along the first optical path towards a center portion of a lighting profile of a lateral direction of the lens.

9. The side emitting LED of claim 7, wherein the light entered the lens through the incident surface does not cross with the first transitive surface.

10. The side emitting LED of claim 9, wherein an extended direction of the first transitive surface is coinciding with a connection line formed between a cross point of an emission surface of the light source to the central optic axis and a juncture of the first transitive surface and the first refractive surface.

11. The side emitting LED of claim 7, wherein a juncture of the second transitive surface and the third refractive surface is located on a connection line formed between a cross point of an emission surface of the LED chip to central optic axis, and a juncture of the first refractive surface and the second refractive surface.

12. The side emitting LED of claim 7, wherein the third refractive surface has a smooth arch and is located between the second transitive surface and the bottom surface.

* * * * *